United States Patent
Barth, Jr.

(10) Patent No.: US 8,014,218 B2
(45) Date of Patent: Sep. 6, 2011

(54) CAPACITIVELY ISOLATED MISMATCH COMPENSATED SENSE AMPLIFIER

(75) Inventor: John E. Barth, Jr., Williston, VT (US)

(73) Assignee: International Business Machines Corporation, Armonk, NY (US)

(*) Notice: Subject to any disclaimer, the term of this patent is extended or adjusted under 35 U.S.C. 154(b) by 159 days.

(21) Appl. No.: 12/343,554

(22) Filed: Dec. 24, 2008

(65) Prior Publication Data

US 2010/0157698 A1    Jun. 24, 2010

(51) Int. Cl.
*G11C 7/06* (2006.01)

(52) U.S. Cl. ......... 365/189.15; 365/189.16; 365/189.25; 365/193; 365/196; 327/85

(58) Field of Classification Search ...................... None
See application file for complete search history.

(56) References Cited

U.S. PATENT DOCUMENTS

| | | | |
|---|---|---|---|
| 5,168,461 A * | 12/1992 | Wu et al. .................. | 708/822 |
| 5,381,364 A | 1/1995 | Chern et al. | |
| 5,959,878 A | 9/1999 | Kamp | |
| 6,181,621 B1 | 1/2001 | Lovett | |
| 6,191,989 B1 | 2/2001 | Luk et al. | |
| 6,674,328 B2 | 1/2004 | Uto et al. | |
| 6,819,600 B2 | 11/2004 | Sim | |
| 7,123,531 B2 | 10/2006 | Rho | |
| 7,164,612 B1 | 1/2007 | Eleyan et al. | |
| 7,221,605 B2 | 5/2007 | Forbes | |
| 7,227,798 B2 | 6/2007 | Gupta et al. | |
| 7,286,416 B2 | 10/2007 | Ooishi et al. | |
| 2003/0112684 A1 | 6/2003 | Barth, Jr. | |
| 2004/0037138 A1 | 2/2004 | Barth, Jr. | |
| 2005/0237400 A1 | 10/2005 | Blerkom et al. | |
| 2006/0119329 A1 | 6/2006 | Jacobs et al. | |
| 2006/0262622 A1 * | 11/2006 | Forbes .......................... | 365/205 |
| 2007/0025170 A1 | 2/2007 | Barth, Jr. et al. | |
| 2007/0097768 A1 | 5/2007 | Barth, Jr. | |
| 2008/0116966 A1 * | 5/2008 | Chae et al. .................... | 327/554 |

FOREIGN PATENT DOCUMENTS

EP     928056 A2    7/1999

OTHER PUBLICATIONS

"A High Speed, Small-Area, Threshold-Voltage-Mismatch Compensation Sense Amplifier for Gigabit-Scale DRAM Arrays"; Authors: Takayuki Kawahara, Takeshi Sakata, Kiyoo Itoh, Yoshiki Kawajiri, Takesada Akiba, Goro Kitsukawa and Masakazu Aoki, IEEE Journal of Solid-State Circuits, vol. 28, No. 7, 1993, pp. 816-823.

(Continued)

*Primary Examiner* — Hoai V Ho
*Assistant Examiner* — James G Norman
(74) *Attorney, Agent, or Firm* — Cantor Colburn LLP; Michael LeStrange

(57) ABSTRACT

According to an embodiment of the invention, a sense amplifier for, e.g., an array of DRAM data storage cells includes one or more amplifier stages connected together in series. The amplifier stages together form the sense amplifier for the DRAM array. Each amplifier stage includes an isolation capacitor to reduce to a relatively small value any mismatch between the threshold voltages of the transistors within each amplifier stage. A bitline from the DRAM array of memory cells connects to the first amplifier stage. An output from the last amplifier stage connects to a write back switch, the output of which connects to the bitline at the input of the first amplifier stage.

15 Claims, 8 Drawing Sheets

OTHER PUBLICATIONS

International Search Report; International Application No. PCT/US2009/064544; International Filing Date: Nov. 16, 2009; Date of Mailing: Jan. 20, 2010.

PCT-Written Opinion; International Application No. PCT/US2009/064544; International Filing Date: Nov. 16, 2009; Date of Mailing: Jan. 20, 2010.

* cited by examiner

CAPACITIVELY ISOLATED MISMATCH COMPENSATED SENSE AMPLIFIER

BACKGROUND

The present invention relates generally to memory sense amplifiers, and, more particularly, to a capacitively isolated mismatch compensated sense amplifier.

In dynamic random access memory (DRAM) devices, a sense amplifier is typically utilized to sense the voltage on a common bitline connected to each DRAM storage cell that comprises a storage capacitor and a transistor. The transistor selectively switches the stored capacitor voltage value onto the bitline when that cell is addressed during a read operation. The storage capacitor stores the relatively small voltage value that represents a logical binary "0" or "1" value. As semiconductor device technology continues to evolve towards providing smaller device sizes and more devices per integrated circuit (IC) (and thus smaller voltages utilized within the circuits within the IC), the inherent mismatch in the threshold voltage between the several transistors that typically comprise a sense amplifier becomes increasing difficult and important to properly compensate for.

BRIEF SUMMARY

According to an embodiment of the invention, a sense amplifier for, e.g., an array of DRAM data storage cells includes one or more amplifier stages connected together in series. The amplifier stages together form the sense amplifier for the DRAM array. Each amplifier stage includes an isolation capacitor to reduce to a relatively small value any mismatch between the threshold voltages of the transistors within each amplifier stage. A bitline from the DRAM array of memory cells connects to the first amplifier stage. An output from the last amplifier stage connects to a write back switch, the output of which connects to the bitline at the input of the first amplifier stage.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
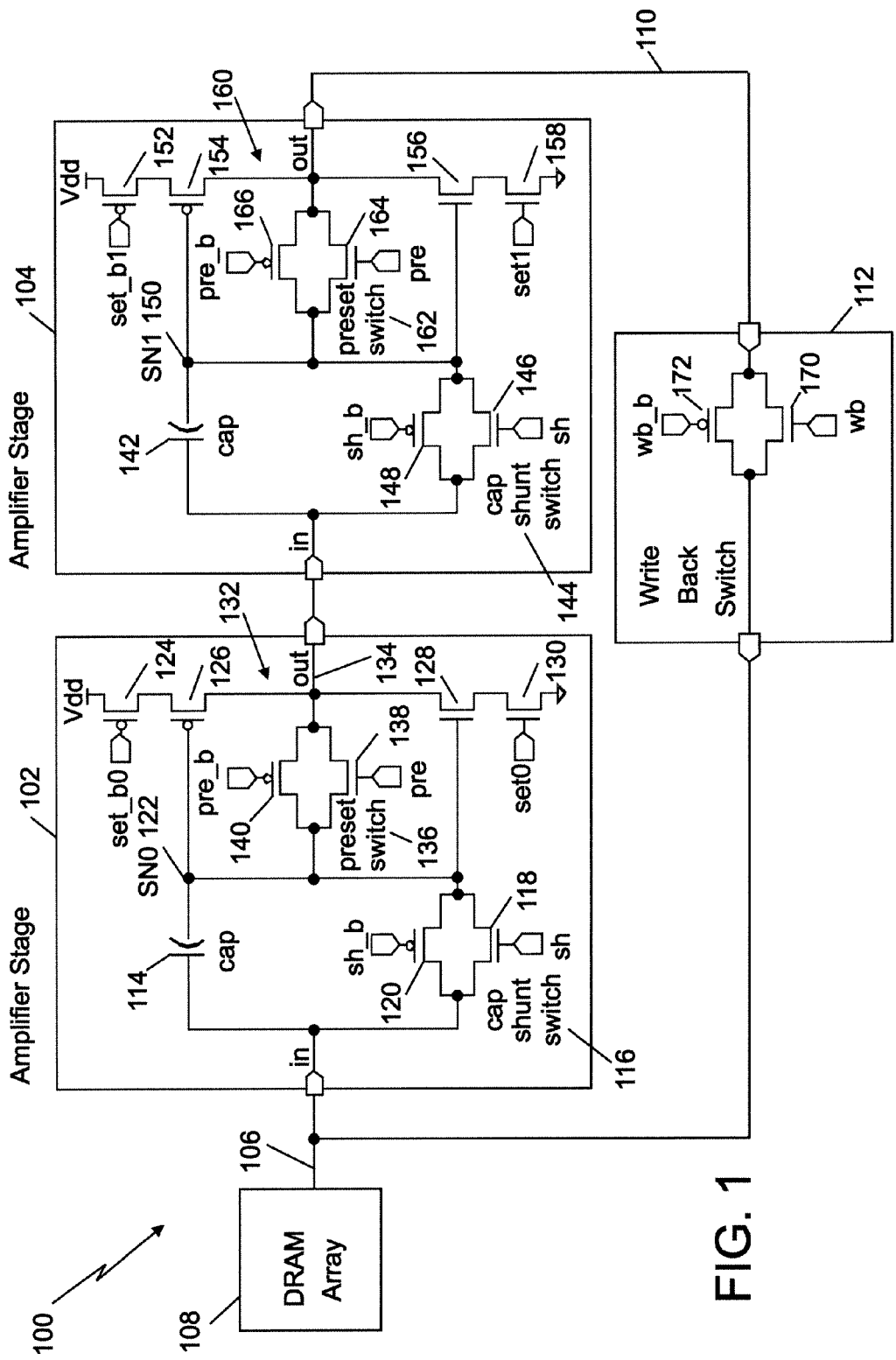
FIG. 1 is a schematic diagram of an embodiment of a two-stage, capacitively isolated mismatch sense amplifier according to an embodiment of the invention.

Referring to FIG. 1, there illustrated is a schematic diagram of a sense amplifier circuit arrangement 100 that includes a pair of identical amplifier stages 102-104 according to an embodiment of the invention. However, only one amplifier stage, or more than two amplifier stages may be utilized in alternative embodiments. The pair of amplifier stages 102-104 comprises the sense amplifier for a DRAM array 108. Typically, such a DRAM array 108 may contain hundreds or thousands of storage cells, each cell including a capacitor for storing a voltage value that represents a logical binary "0" or "1" value and a transistor that switches the voltage value of the storage cell onto a bitline signal line 106. The bitline 106 connects to an input of the first amplifier stage 102 and may be one of a pair of bitlines that provide the "true" and "complement" states of the logical binary value stored in a corresponding one of the DRAM cells in the array 108 that is selected for reading or writing. In the alternative, the DRAM array 108 may comprise another type of an array of memory cells, such as those comprising a static RAM (SRAM) device. An output on a line 110 from the second amplifier stage 104 connects to a write back switch 112, and an output signal on a line from the output of the write back switch 112 connects back to the bitline 106.

With respect to the first amplifier stage 102, the bitline 106 connects to both an isolation capacitor 114 and a capacitor shunt switch 116, where the capacitor 114 and the shunt switch 116 are connected in parallel. In accordance with an embodiment of the invention, the value of the capacitor 114 may be approximately ten times larger than the input capacitance of a gated inverter 132. The capacitor shunt switch 116 may include an NFET 118 and a PFET 120 connected in parallel. The gate of the NFET 118 is controlled by a signal, sh, while the gate of the PFET 120 is controlled by a signal, sh_b. The function of the capacitor shunt switch 116 is described hereinafter. The output side of the capacitor 114 and the capacitor shunt switch 116 connect together at a signal node, sn0 122. Four transistors 124-130 connect in series between a supply voltage, Vdd and ground. The four transistors 124-130 form the gated inverter 132 of the first amplifier stage 102. The signal node, sn0 122, connects to the gate of the transistors 126-128, which function as amplifiers. Thus, the signal node, sn0 122, is the input to the gated inverter 132 of the first amplifier stage 102. The other two transistors 124, 130 function as power gates as part of the gated inverter 132. The connection point between the transistors 126-128 forms an output on a line 134 of the first amplifier stage 102. The gate of the transistor 124 is controlled by a signal, set_b0, while the gate of the transistor 130 is controlled by a signal, set0. The first amplifier stage 102 also includes a preset switch or inverter shunt device 136 formed by an NFET 138 and a PFET 140 connected in parallel. An input side of the preset switch 136 connects to the signal node, sn0 122, while an output side of the preset switch 136 connects to the output 134 of the first amplifier stage 102. The gate of the NFET 138 is controlled by a signal, pre, while the gate of the PFET 140 is controlled by a signal, pre_b.

As mentioned, the second amplifier stage 104 may be identical to the first amplifier stage 102. The output signal 134 from the first amplifier stage 102 connects at an input of the second amplifier stage 104. The second amplifier stage 104 includes a capacitor 142 and a capacitor shunt switch 144 that comprises an NFET 146 and a PFET 148. A signal node, sn1 150, is provided. Four transistors 152-158 connect in series and form a gated inverter 160 of the second amplifier stage 104, the output of which is provided on a line 110. Thus, the signal node, sn1 150, is the input to the gated inverter 160 of the second amplifier stage 104. A preset switch or inverter shunt device 162 includes an NFET 164 and a PFET 166. The various gate control signals provided to the various transistors within the second amplifier stage 104 are indicated in FIG. 1.

The output signal on the line 110 from the second amplifier stage 104 connects to an input of the write back switch 112, which includes an NFET 170 and a PFET 172 connected in parallel. The gate of the NFET 170 is controlled by a signal, wb, while the gate of the PFET 172 is controlled by a signal, wb_b 172. The output of the write back switch 112 connects back to the bitline 106.

Figure 7:
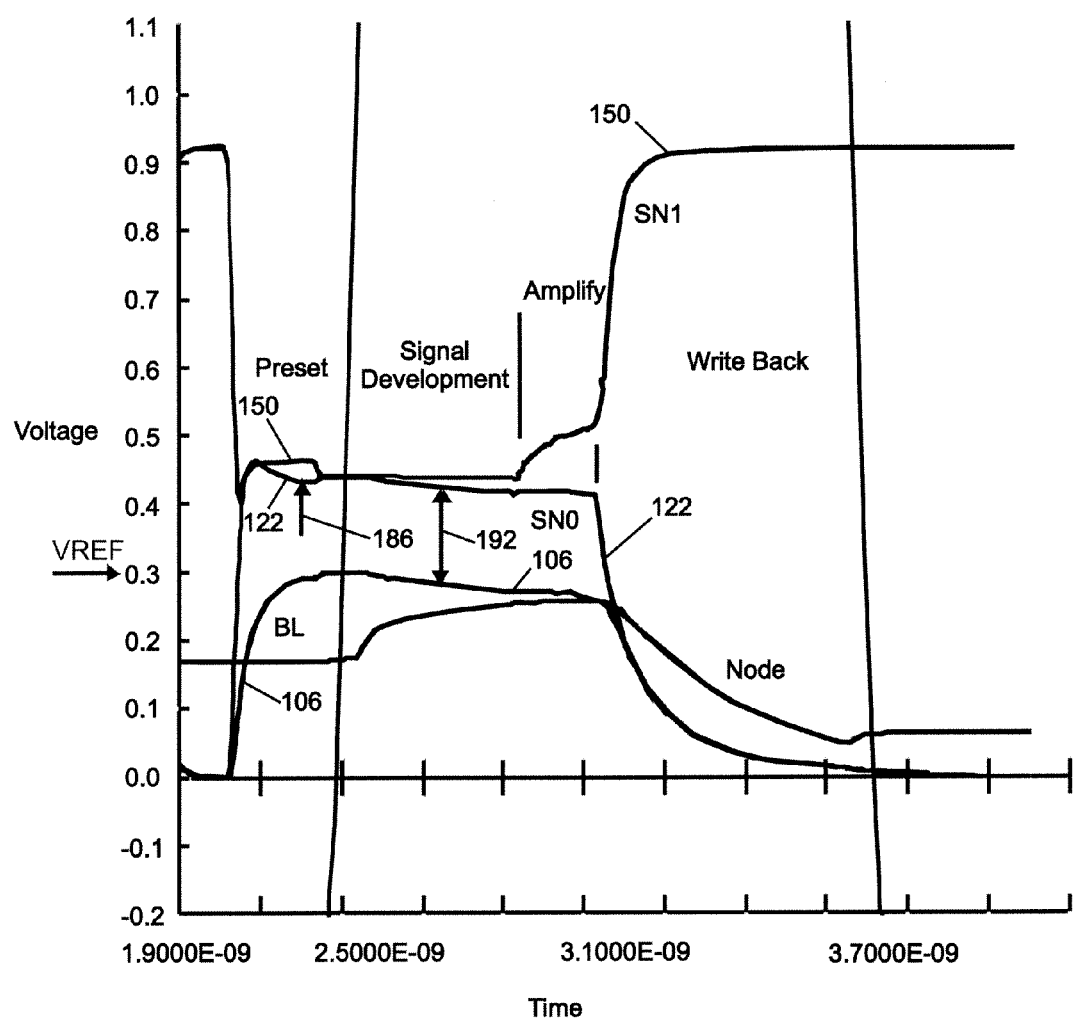
FIG. 7 is a graph of various signals within the amplifier of FIG. 1 when reading a "0" stored in a DRAM memory array.
Figure 8:
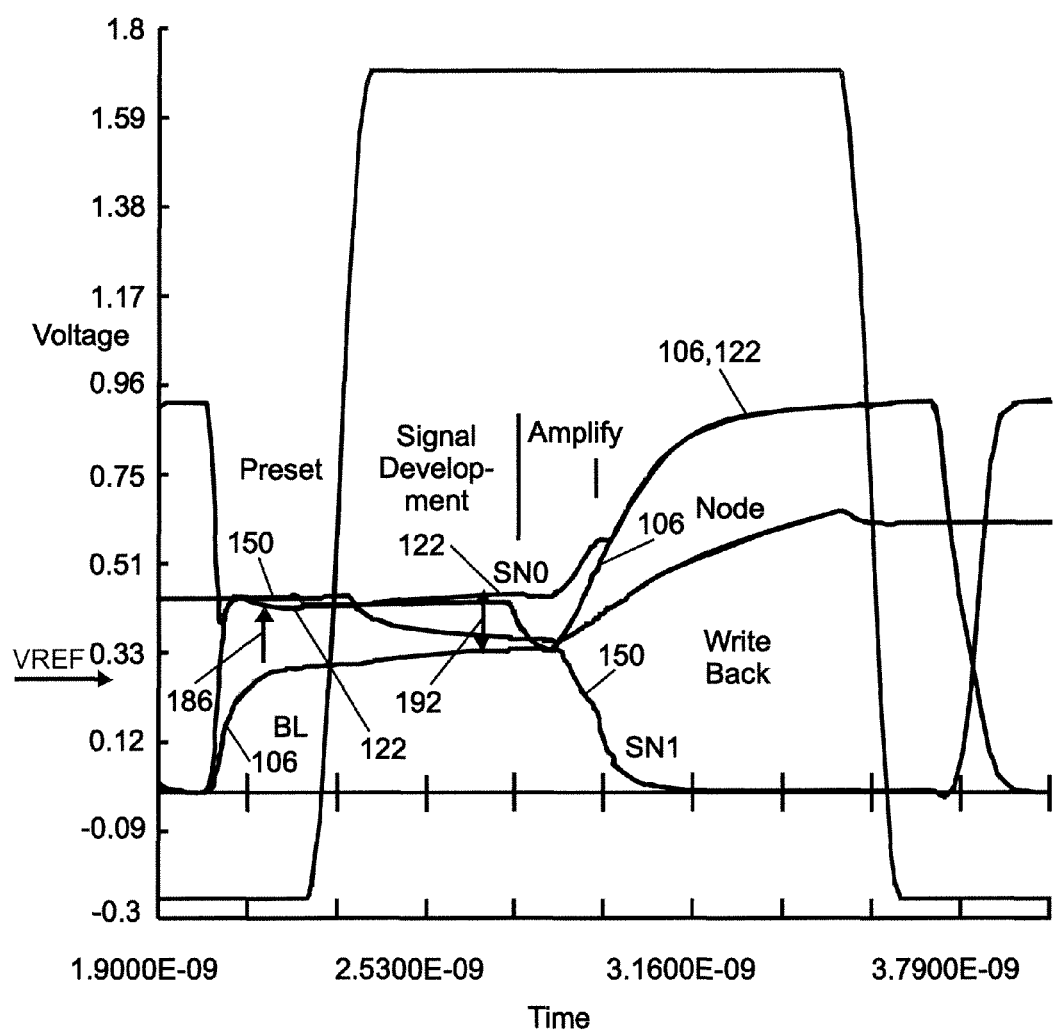
FIG. 8 is a graph of various signals within the amplifier of FIG. 1 when reading a "1" stored in a DRAM memory array.

The operation of the sense amplifier circuit arrangement 100 is best understood by a description of the various modes of operation of the first and second amplifier stages 102-104 and the write back switch 112. FIGS. 2-6 each illustrates in simplified form the circuit arrangement 100 in a particular mode of operation. Further, the graphs of FIGS. 7 and 8 illustrate the voltage values of various signals within the circuit arrangement 100 over a period of time. Specifically, FIG. 7 illustrates the condition where a logical binary "0" is read out from one of the cells in the array 108. FIG. 8 illustrates the condition where a logical "1" is read out from one of the cells in the array 108.

Figure 2:
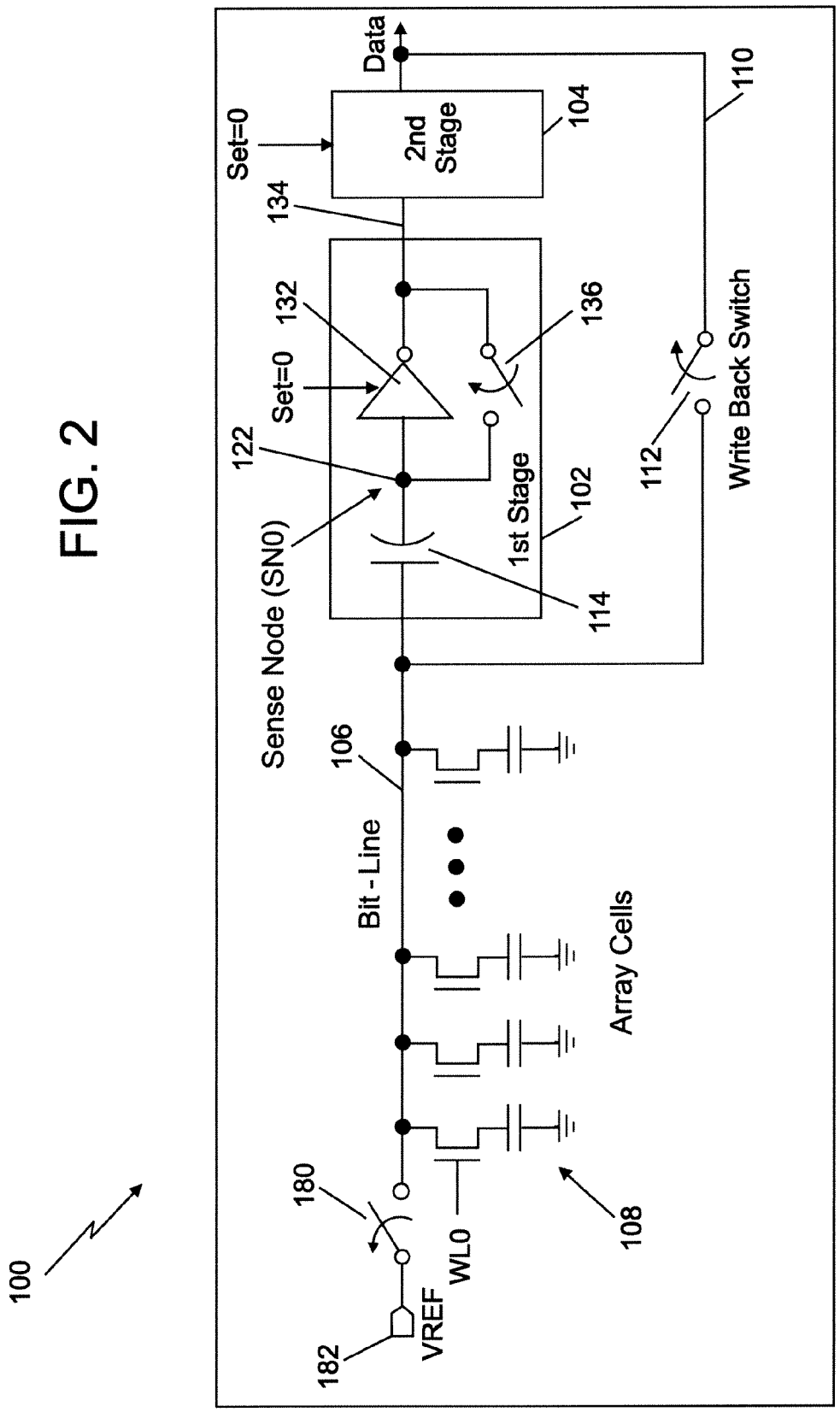
FIG. 2 is a simplified block diagram of the amplifier of FIG. 1 in a pre-charge mode of operation.

FIG. 2 illustrates a pre-charge mode of operation of the sense amplifier circuit arrangement of FIG. 1. During the pre-charge mode, the bitline 106 is driven to a pre-charge level, zero volts in this case but could be any arbitrary level optimized for cell retention. The two gated inverters 132, 160 within the first and second amplifier stages 102-104, respectively, are floated or gated off. This is illustrated in FIGS. 7 and 8 at the beginning of the time period of the respective graphs of these figures where the value of the voltage on the bitline 106 (BL) is at zero volts.

Figure 3:
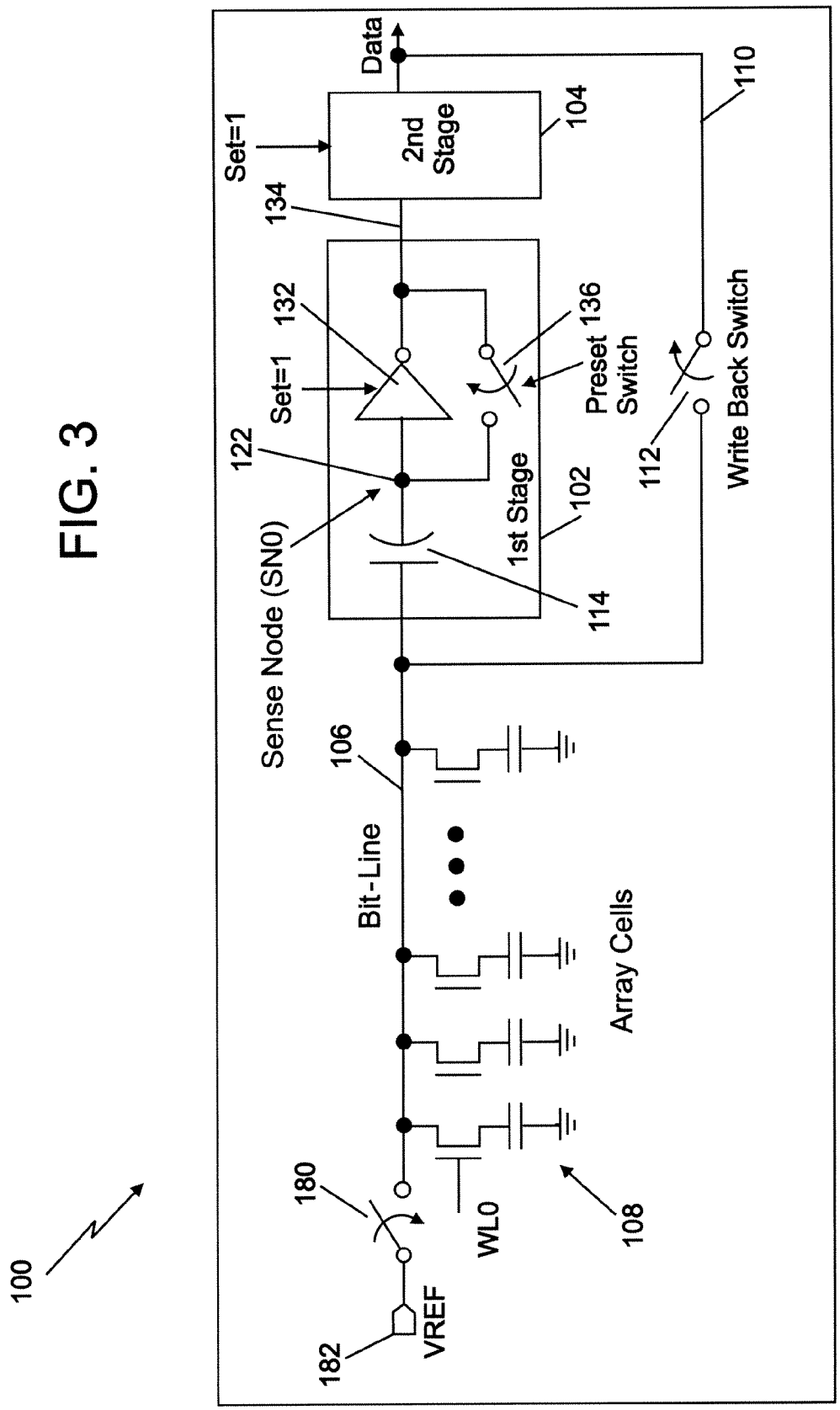
FIG. 3 is a simplified block diagram of the amplifier of FIG. 1 in a preset mode of operation.

FIG. 3 illustrates a preset mode of operation in which a switch 180 is closed and a voltage reference, Vref, 182 of approximately 300 millivolts (mV) is applied to the bitline 106 and the gated inverters 132, 160 within the corresponding first and second amplifier stages 102-104 are each preset to their respective voltage trip points. This mode of operation demonstrates the desired mismatch offset compensation in which the voltage difference between the nodes, sn0 122 and sn1 150, is brought to a relatively small value, as indicated by the difference between the signal traces for sn0 122 and sn1 150, where this voltage difference is indicated by the line with the arrowhead 186 in both FIGS. 7 and 8. This is achieved by temporarily turning on the switch or pass transistors 124 and 130 in the first amplifier stage 102 and the similar transistors 152 and 158 in the second amplifier stage, while at the same time closing the preset switch or inverter shunt switch 136, 162 in the respective stages 102-104 which effectively shorts together the input and output of each gated inverter 132, 160. The isolation capacitors 114, 142 in each stage 102-104 thus assist in removing as much of the mismatch between the threshold voltages of the various transistors in each stage 102-104. As seen in FIGS. 7-8, the trip point for the signal node, sn0 122, of the first amplifier stage 102 is approximately equal to the trip point for the signal node, sn1 150, of the second amplifier stage 104, with both trip points being approximately 450 mV.

Figure 4:
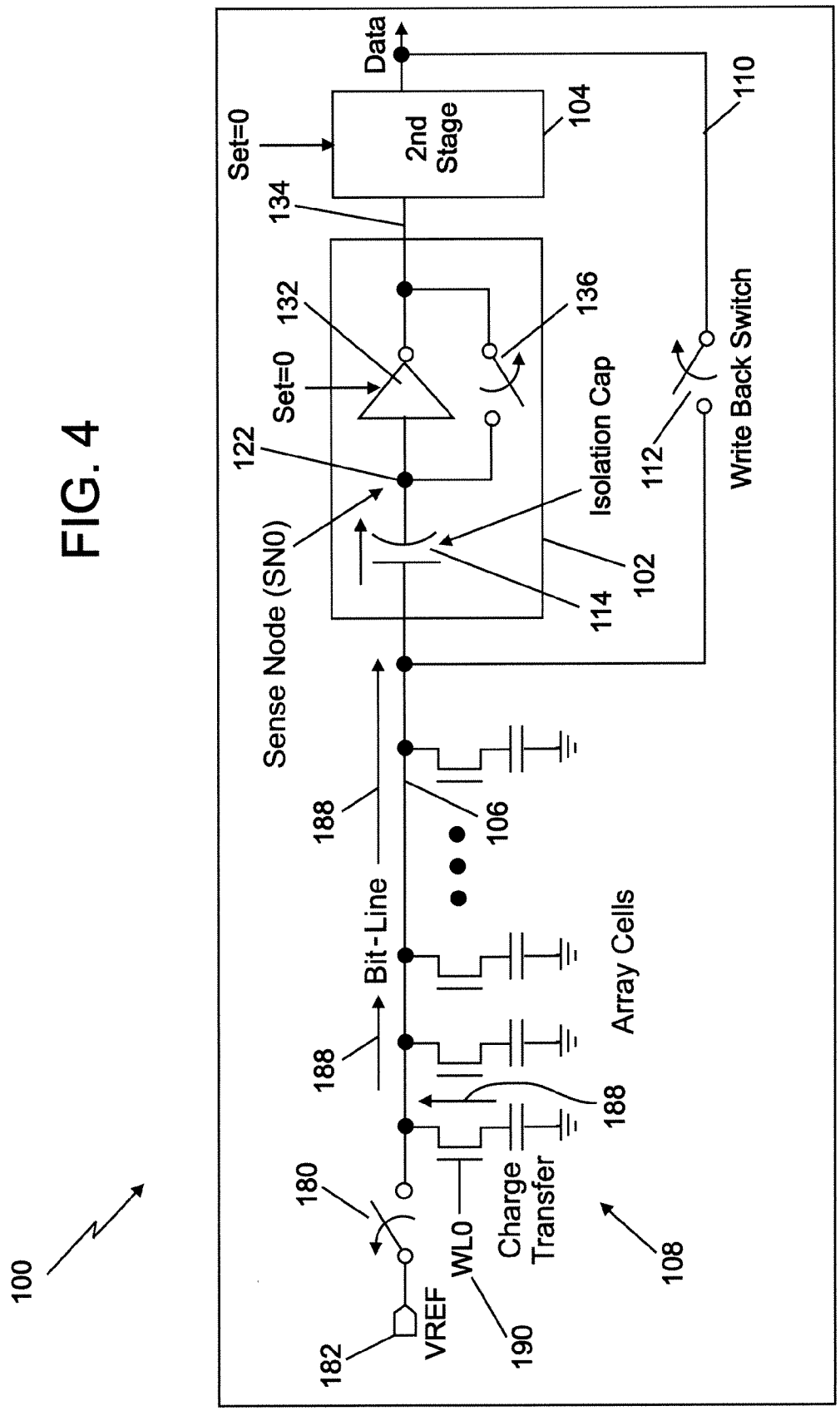
FIG. 4 is a simplified block diagram of the amplifier of FIG. 1 in a signal development mode of operation.

FIG. 4 illustrates a signal development mode of operation in which the first and second amplifier stages 102-104 are "floated" by turning off the gated inverters 132, 160, after which a selected one of the array cells 108 transfers its stored amount of electrical charge to the bitline 106 as indicated by the lines with arrowheads 188 in FIG. 4. In this mode, switch 180 is open and the preset switches or the inverter shunt switches 136, 162 are turned off. One of the array cells is selected by asserting the word line, wl0 190. The isolation capacitor 114 within the first amplifier stage 102 transfers any electrical charge on the bitline 106 to the sense node 122. Referring to FIGS. 7-8, the amount of charge that is transferred from the bitline 106 to the signal node, sn0 122, is indicated by the line with arrowheads 192.

Figure 5:
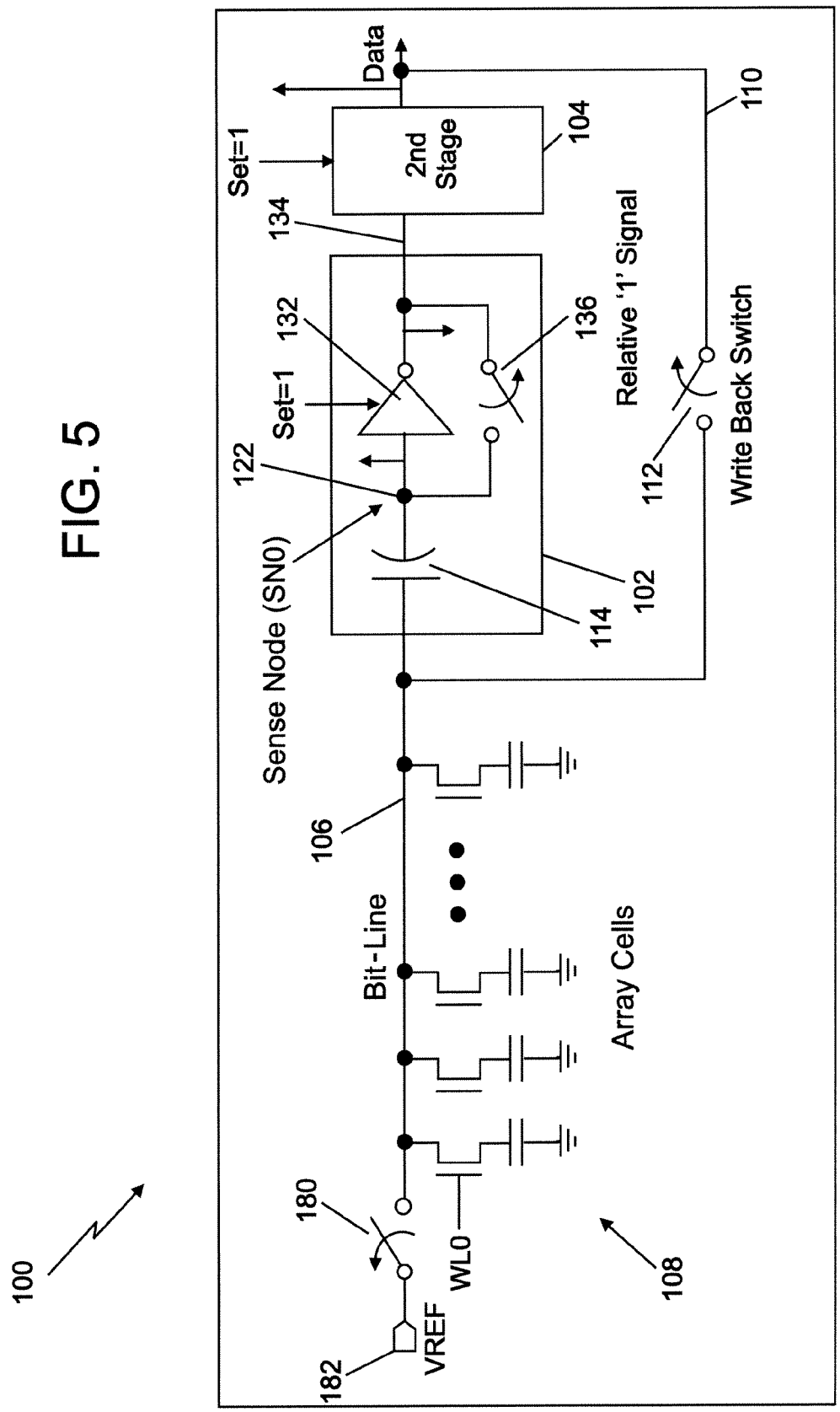
FIG. 5 is a simplified block diagram of the amplifier of FIG. 1 in an amplify mode of operation.

FIG. 5 illustrates an amplify mode of operation in which the first and second amplifier stages 102-104 amplify the voltages at the first and second signal nodes, sn0 122 and sn1 150, respectively. This is achieved by turning on the switch or pass transistors 124, 130 in the first amplifier stage 102 and the similar transistors 152, 158 in the second amplifier stage 104. This allows the amplifying transistors 126-128 in the first amplifier stage 102 and the amplifying transistors 154-156 in the second amplifier stage 104 to amplify the voltages at the respective signal nodes, sn0 122 and sn1 150, of each stage 102-104. For the read "0" operation indicated in the graph of FIG. 7, the voltage at the signal node, sn0 122, is driven to farther below the trip point, wherein the gated inverter 132 inverts this low going voltage and provides a high voltage signal at the output 134 of the first amplifier stage 102. For the read "1" operation indicated in the graph of FIG. 8, the voltage at the signal node, sn0 122, is driven to farther above the trip point, wherein the gated inverter 132 inverts this high going voltage and provides a low voltage signal at the output 134 of the first amplifier stage 102. The second amplifier stage 104 operates in a similar manner wherein for a read "0" operation the voltage at the signal node, sn1 150, is a high going voltage that is inverted by the gated inverter 160 of the second stage 104 (FIG. 7), and where for a read "1" operation the voltage at the signal node, sn1 150, is a low going voltage that is inverted by the gated inverter 160 (FIG. 8).

Figure 6:
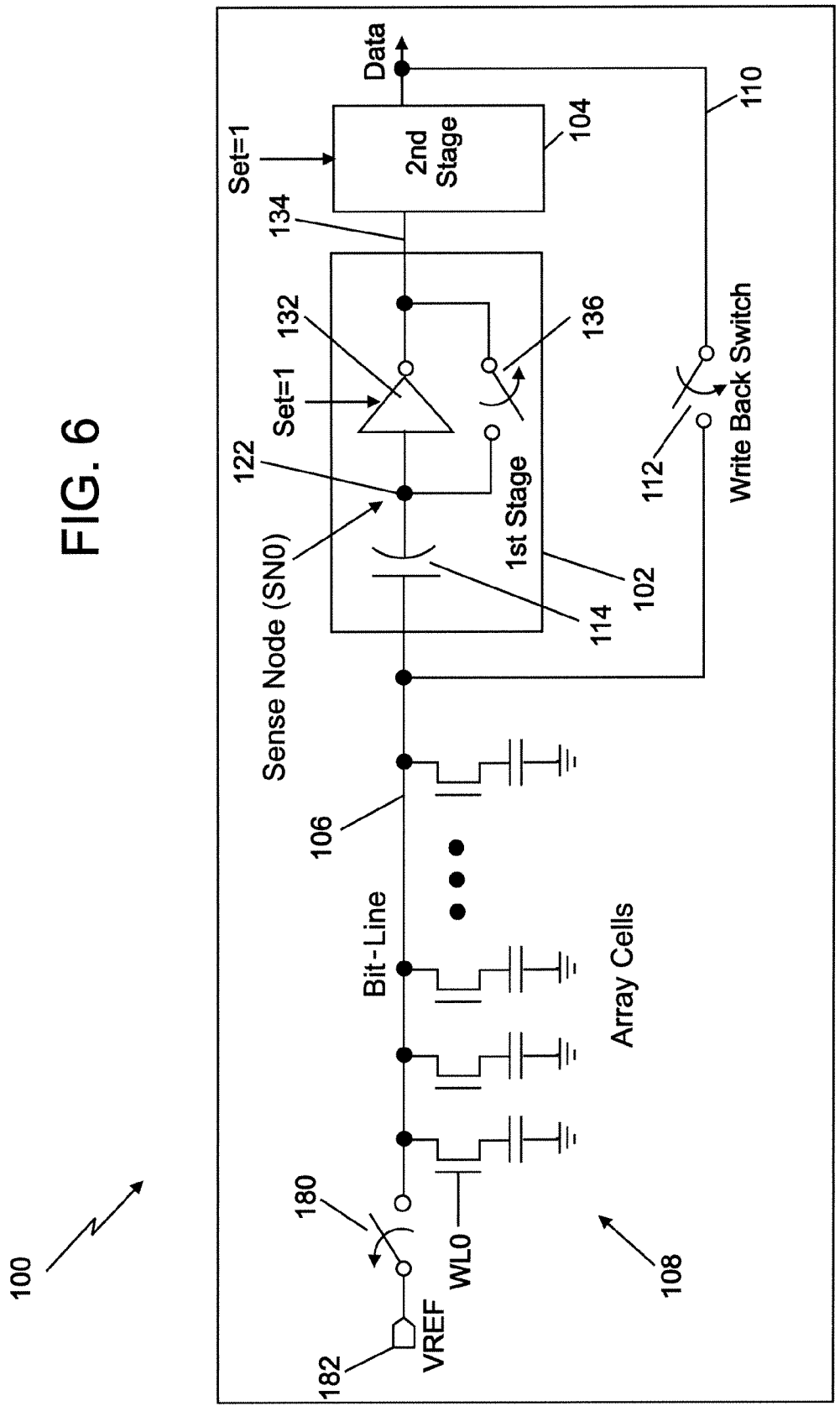
FIG. 6 is a simplified block diagram of the amplifier of FIG. 1 in a write back mode of operation.

FIG. 6 illustrates a write back mode of operation which follows the amplify mode of operation. In the write back mode, the write back switch 112 is closed, thereby reinforcing the voltage level on the bitline 106 at either a high or low voltage level, depending on the voltage value of the particular array cell that was read out in either the read "0" or read "1" operations described above. Also, the capacitor shunt switches 116, 144 are both closed during this mode of operation to avoid any power burn from analog voltage levels.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device, comprising:
    a first amplifier stage having an input signal applied thereto;
    wherein the first amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the first amplifier stage further includes a gated inverter, with respect to power and ground terminals, that connects to the signal node and an inverter shunt switch that connects between the signal node and an output of the inverter;
    wherein the input signal is on a bitline from a DRAM array of memory cells, and wherein the first amplifier stage comprises a sense amplifier for the DRAM array of memory cells; and
    a write back switch that connects to an output of the first amplifier stage and that provides an output that connects to the bitline, wherein when the write back switch is selectively closed a reinforcing voltage value is applied to the bitline, and wherein the capacitor shunt switch is also selectively closed when the write back switch is selectively closed.

2. The device of claim 1, further comprising a second amplifier stage having an input that connects with an output of the first amplifier stage, the second amplifier stage having an isolation capacitor and a capacitor shunt switch connected in parallel and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter.

3. A device, comprising:
    a first amplifier stage having an input signal applied thereto;
    wherein the first amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the first amplifier stage further includes a gated inverter, with respect to power and ground terminals, that connects to the signal node and an inverter shunt switch that connects between the signal node and an output of the inverter; and
    a second amplifier stage having an input that connects with an output of the first amplifier stage, the second amplifier stage having an isolation capacitor and a capacitor shunt switch connected in parallel and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter;
    wherein during a preset period of operation of the first and second amplifier stages, a difference in voltage between the signal node of the first amplifier stage and the signal node of the second amplifier stage has a value that precludes any incorrect reading of a binary logic level represented by a voltage value on the input signal, and wherein power to the gated inverter is temporarily turned on.

4. A sense amplifier, comprising:
    a first amplifier stage having an input signal applied thereto, wherein the first amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the first amplifier stage further includes a gated inverter, with respect to power and ground terminals, that connects to the signal node and an inverter shunt switch that connects between the signal node and an output of the inverter, and wherein the input signal is on a bitline from an array of memory cells;
    a second amplifier stage having an input that connects with an output of the first amplifier stage, the second amplifier stage having an isolation capacitor and a capacitor shunt switch connected in parallel across the isolation capacitor and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter; and
    a write back switch that connects to an output of the second amplifier stage and that provides an output that connects to the bitline, wherein when the write back switch is selectively closed a reinforcing voltage value is applied to the bitline, and wherein the capacitor shunt switches for the first and second amplifier stages are also selectively closed when the write back switch is selectively closed.

5. A sense amplifier, comprising:
    a first amplifier stage having an input signal applied thereto, wherein the first amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the first amplifier stage further includes a gated inverter, with respect to power and ground terminals, that connects to the signal node and an inverter shunt switch that connects between the signal node and an output of the inverter, and wherein the input signal is on a bitline from an array of memory cells; and
    a second amplifier stage having an input that connects with an output of the first amplifier stage, the second amplifier stage having an isolation capacitor and a capacitor shunt switch connected in parallel across the isolation capacitor and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter;
    wherein during a preset period of operation of the first and second amplifier stages, a difference in voltage between the signal node of the first amplifier stage and the signal node of the second amplifier stage has a value that precludes any incorrect reading of a binary logic level represented by a voltage value on the input signal, and wherein power to the gated inverter is temporarily turned on.

6. A sense amplifier, comprising:
   a first amplifier stage having an input signal applied thereto, wherein the first amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the first amplifier stage further includes a gated inverter, with respect to power and ground terminals, that connects to the signal node and an inverter shunt switch that connects between the signal node and an output of the inverter, and wherein the input signal is on a bitline from an array of memory cells; and
   a second amplifier stage having an input that connects with an output of the first amplifier stage, the second amplifier stage having an isolation capacitor and a capacitor shunt switch connected in parallel across the isolation capacitor and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter;
   wherein during a signal development mode of operation the first and second amplifier stages are floated by power to the gated inverter being turned off, and a selected one of the array of memory cells transfers its stored amount of electrical charge to the bitline, wherein the isolation capacitor of the first amplifier stage transfers any electrical charge on the bitline to the sense node of the first amplifier stage.

7. The sense amplifier of claim 4, where the array of memory cells comprises a DRAM array of memory cells.

8. Apparatus, comprising:
   first and second amplifier stages, each stage having an input signal applied thereto, wherein each stage includes an isolation capacitor and a capacitor shunt switch connected across the isolation capacitor in parallel and having the input signal applied thereto and wherein an output of the isolation capacitor and the capacitor shunt switch connect at a signal node of each corresponding stage, wherein each stage further includes a gated inverter, with respect to power and ground terminals, that connects to the signal node for that stage and an inverter shunt switch that connects between the signal node for that stage and an output of the inverter;
   wherein the input signal of the first amplifier stage is on a bitline from an array of memory cells, and wherein the input signal of the second amplifier stage is from an output of the inverter of the first amplifier stage; and
   a write back switch that connects to an output of the second amplifier stage and that provides an output that connects to the bitline, wherein when the write back switch is selectively closed a reinforcing voltage value is applied to the bitline, and wherein the capacitor shunt switch is also selectively closed when the write back switch is selectively closed.

9. The apparatus of claim 8, wherein the array of memory cells comprises a DRAM array of memory cells.

10. The apparatus of claim 8, wherein the first and second amplifier stages comprise a sense amplifier for the array of memory cells.

11. Apparatus, comprising:
    first and second amplifier stages, each stage having an input signal applied thereto, wherein each stage includes an isolation capacitor and a capacitor shunt switch connected across the isolation capacitor in parallel and having the input signal applied thereto and wherein an output of the isolation capacitor and the capacitor shunt switch connect at a signal node of each corresponding stage, wherein each stage further includes a gated inverter, with respect to power and ground terminals, that connects to the signal node for that stage and an inverter shunt switch that connects between the signal node for that stage and an output of the inverter;
    wherein the input signal of the first amplifier stage is on a bitline from an array of memory cells, and wherein the input signal of the second amplifier stage is from an output of the inverter of the first amplifier stage; and
    wherein during a preset period of operation of the first and second amplifier stages, a difference in voltage between the signal node of the first amplifier stage and the signal node of the second amplifier stage has a value that precludes any incorrect reading of a binary logic level represented by a voltage value on the input signal, and wherein power to the gated inverter is temporarily turned on.

12. An amplifying device, comprising:
    at least one amplifier stage having an input signal applied thereto, wherein the input signal is on a bitline from an array of memory cells, wherein the at least one amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the at least one amplifier stage further includes a gated inverter, with respect to power and ground terminals, that connects to the signal node and an output of the inverter, and wherein the amplifying device includes various modes of operation to read a voltage value from one of the memory cells and to write a voltage value to one of the memory cells;
    a second amplifier stage having an input that connects with an output of the at least one amplifier stage, the second amplifier stage having an isolation capacitor and a capacitor shunt switch connected across the isolation capacitor in parallel and wherein an output of the isolation capacitor and the capacitor shunt switch connect at a signal node, wherein the second amplifier stage further includes a gated inverter, with respect to power and ground terminals, that connects to the signal node and an inverter shunt switch that connects between the signal node and an output of the inverter; and
    a write back switch that connects to an output of the second amplifier stage and that provides an output that connects to the bitline, wherein when the write back switch is selectively closed during a write back mode of operation of the amplifying device a reinforcing voltage value is applied to the bitline, and wherein the capacitor shunt switch is also selectively closed when the write back switch is selectively closed.

13. The amplifying device of claim 12, wherein during a preset mode of operation of the amplifying device, a difference in voltage between the signal node of the at least one amplifier stage and the signal node of the second amplifier stage has a value that precludes any incorrect reading of a binary logic level represented by a voltage value on the input signal, and wherein power to the gated inverter is temporarily turned on.

14. The amplifying device of claim 12, wherein in an amplify mode of operation of the amplifying device a read mode of operation occurs, wherein for a read operation of a binary logic "0" value on the bitline the voltage at the signal node of the at least one amplifier stage is amplified to farther below a trip point, wherein the inverter of the at least one amplifier stage inverts the voltage at the signal node of the at least one amplifier stage and provides a high voltage signal at an output of the at least one amplifier stage, wherein for a read operation of a binary "1" on the bitline the voltage at the signal node of the at least one amplifier stage is amplified to farther above the trip point, wherein the inverter of the at least one amplifier stage inverts the voltage at the signal node of the at least one amplifier stage and provides a low voltage signal at the output of the at least one amplifier stage.

15. An amplifying device, comprising:
  at least one amplifier stage having an input signal applied thereto, wherein the input signal is on a bitline from an array of memory cells, wherein the at least one amplifier stage includes an isolation capacitor and a capacitor shunt switch connected across the isolation capacitor in parallel and having the input signal applied thereto and wherein an output of the isolation capacitor and the capacitor shunt switch connect at a signal node, wherein the at least one amplifier stage further includes a gated inverter, with respect to power and ground terminals, that connects to the signal node and an output of the inverter, and wherein the amplifying device includes various modes of operation to read a voltage value from one of the memory cells and to write a voltage value to one of the memory cells;
  wherein during a signal development mode of operation the at least one and second amplifier stages are floated by power to the gated inverter being turned off, and a selected one of the array of memory cells transfers its stored amount of electrical charge to the bitline, wherein the isolation capacitor of the at least one amplifier stage transfers any electrical charge on the bitline to the sense node of the at least one amplifier stage.

* * * * *